United States Patent
Sheng

(10) Patent No.: US 7,193,483 B2
(45) Date of Patent: Mar. 20, 2007

(54) BLOCKING A LEAKAGE CURRENT

(75) Inventor: Wenjun Sheng, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 28 days.

(21) Appl. No.: 11/089,310

(22) Filed: Mar. 24, 2005

(65) Prior Publication Data

US 2006/0214740 A1    Sep. 28, 2006

(51) Int. Cl.
*H03B 5/36* (2006.01)
*H03L 1/00* (2006.01)

(52) U.S. Cl. ............................ 331/108 C; 331/116 FE; 331/158; 331/175

(58) Field of Classification Search ............ 331/108 C, 331/116 R, 116 FE, 158, 175
See application file for complete search history.

(56) References Cited

U.S. PATENT DOCUMENTS 7,038,549 B2 *   5/2006   Tomita .................... 331/44

* cited by examiner

*Primary Examiner*—David Mis
(74) *Attorney, Agent, or Firm*—Trop, Pruner & Hu, P.C.

(57) ABSTRACT

An apparatus includes an oscillator circuit that includes terminals to couple a second circuit having an impedance to the oscillator circuit. The apparatus includes a third circuit that is coupled to at least one of the terminals to isolate a leakage current from at least part of the oscillator circuit.

37 Claims, 6 Drawing Sheets

BLOCKING A LEAKAGE CURRENT

BACKGROUND

The invention generally relates to blocking a leakage current.

A typical semiconductor package includes one or more semiconductor dies that contain integrated circuitry and external terminals (leads or bumps, for example) to electrically connect the package to other electrical components. The die(s) typically contain bonding pads, which are exposed sites on the die(s) at which electrically conductive bonds are formed between the integrated circuitry and the external terminals of the semiconductor package.

Each external terminal of the semiconductor package may potentially communicate an electrostatic discharge (ESD) to the integrated circuitry of the package. An ESD is a rapid and spontaneous transfer of electrostatic charge between two bodies, which is initiated by an electrostatic potential difference between the bodies. Thus, an ESD may occur, for example, when a particular external terminal of the semiconductor package contacts a body (a machine, a human body, a shipping material, etc.) that has a different electrostatic potential. The ESD typically produces a voltage fluctuation, or spike, on the external terminal; and this voltage spike may be capable of damaging integrated circuitry of the semiconductor package.

For purposes of preventing damage from an ESD, a conventional integrated circuit may have an ESD protection circuit for each bonding pad to reduce, or dampen, an ESD-induced voltage spike that may otherwise propagate to the pad and onto other circuitry that is electrically coupled to the pad.

SUMMARY

In an embodiment of the invention, an apparatus includes an oscillator circuit that includes terminals to couple a second circuit having an impedance to the oscillator circuit. The apparatus includes a third circuit that is coupled to at least one of the terminals to isolate a leakage current from at least part of the oscillator circuit.

In another embodiment of the invention, a technique includes coupling an electrostatic discharge protection circuit to an oscillator and isolating a leakage current that is generated by the electrostatic discharge protection circuit from at least part of the oscillator.

In another embodiment of the invention, a system includes an oscillator circuit to provide a reference signal. The oscillator circuit includes terminals to couple a second circuit that has an impedance to the oscillator circuit. The system also includes an electrostatic discharge circuit, a fourth circuit and a radio frequency circuit. The electrostatic discharge protection circuit is coupled to one of the terminals and is capable of generating a leakage current. The fourth circuit isolates the leakage current from at least part of the oscillator circuit, and the radio frequency circuit receives the reference signal.

In yet another embodiment of the invention, an apparatus includes a semiconductor die and a circuit. The die includes oscillator circuitry, and the circuit isolates leakage current from at least part of the oscillator circuitry.

Advantages and other features of the invention will become apparent from the following drawing, description and claims.

DETAILED DESCRIPTION

Figure 1:
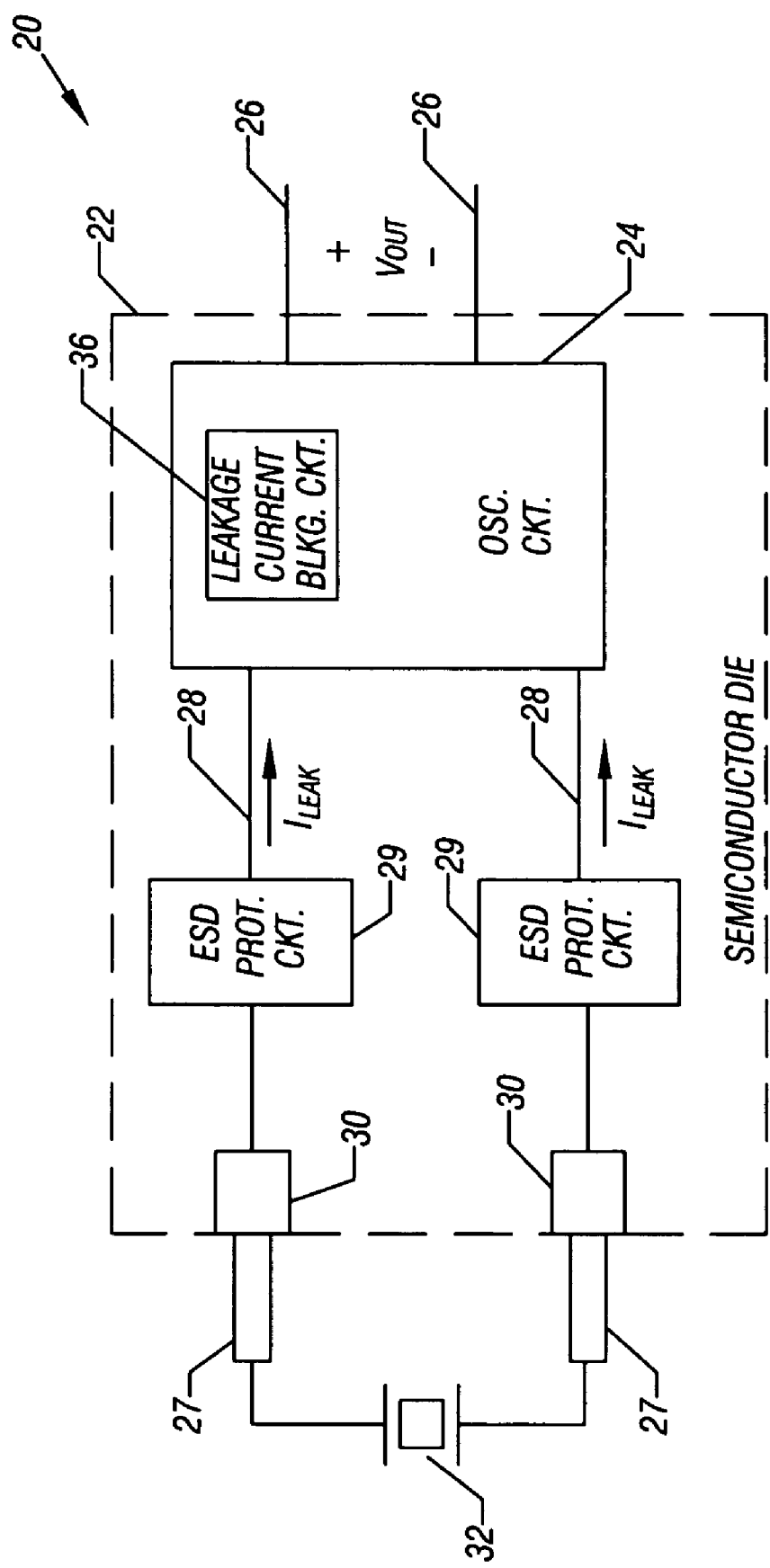
FIG. 1 is a schematic diagram of an integrated circuit oscillator according to an embodiment of the invention.

Referring to FIG. 1, an embodiment 20 of an oscillator in accordance with the invention includes an oscillator circuit 24 that is fabricated on a semiconductor die 22 and a crystal 32 that is external to the die 22. The oscillator circuit 24 includes an amplifier and impedances, at least some of which are coupled to the crystal 32 to form a resonant tank for the oscillator 20. The oscillator 20 generates an analog sinusoidal signal (called "$V_{OUT}$" in FIG. 1) at its output terminals 26. As an example, the $V_{OUT}$ signal may be a reference signal for a transceiver.

In some embodiments of the invention, the semiconductor die 22 may be part of a semiconductor package that includes external crystal connection terminals 27 (e.g., leads or bumps). In the semiconductor package, bonding pads 30 of the semiconductor die 22 are bonded and electrically coupled to the external crystal connection terminals 27; and through one or more metal layers that formed in the semiconductor die 22, the bonding pads 30 are electrically connected to internal crystal connection terminals 28 that extend to the oscillator circuit 24. Thus, electrically, the bonding pads 30 are located between the external crystal connection terminals 27 of the semiconductor package and the internal crystal connection terminals 28.

The semiconductor die 22 may include electrostatic discharge (ESD) protection circuits 29 for purposes of protecting the oscillator 20 from ESD-induced voltage spikes. As depicted in FIG. 1, each bonding pad 30 may be connected to an associated ESD protection circuit 29. It is noted that the ESD protection circuits 29 may be external to the die 22, in some embodiments of the invention.

The ESD protection circuit 29 may include one or more diodes that are capable of generating a composite DC leakage current (called "$I_{LEAK}$" in FIG. 1) into or out of the oscillator 20, if not for features of the oscillator 20 described herein. The leakage current is attributable to conduction of current through the diodes of the ESD protection circuit 29 when the diodes are in their reverse biased states. Such a leakage current may significantly affect the DC biasing in one or more parts of the oscillator 20 and thus, may significantly alter operation of the oscillator 20. However, the oscillator 20 includes a leakage current blocking circuit 36 to block, or isolate, leakage currents that are generated by the ESD protection circuits 29 from the parts of the oscillator 20, which are sensitive to a leakage current.

As a more specific example, in some embodiments of the invention, the oscillator circuit 24 may include a feedback resistor whose relatively high resistance (a resistance in the megaohm range, for example) causes at least part of the oscillator circuit 24 to be sensitive to small changes in the current that flows through the feedback resistor. More particularly, as further described below by way of a specific example, if not for the leakage current blocking circuit 36, the large resistance of the feedback resistor is prone to magnifying any leakage current to the extent that biasing of the oscillator circuit 24 may be significantly altered.

Figure 2:
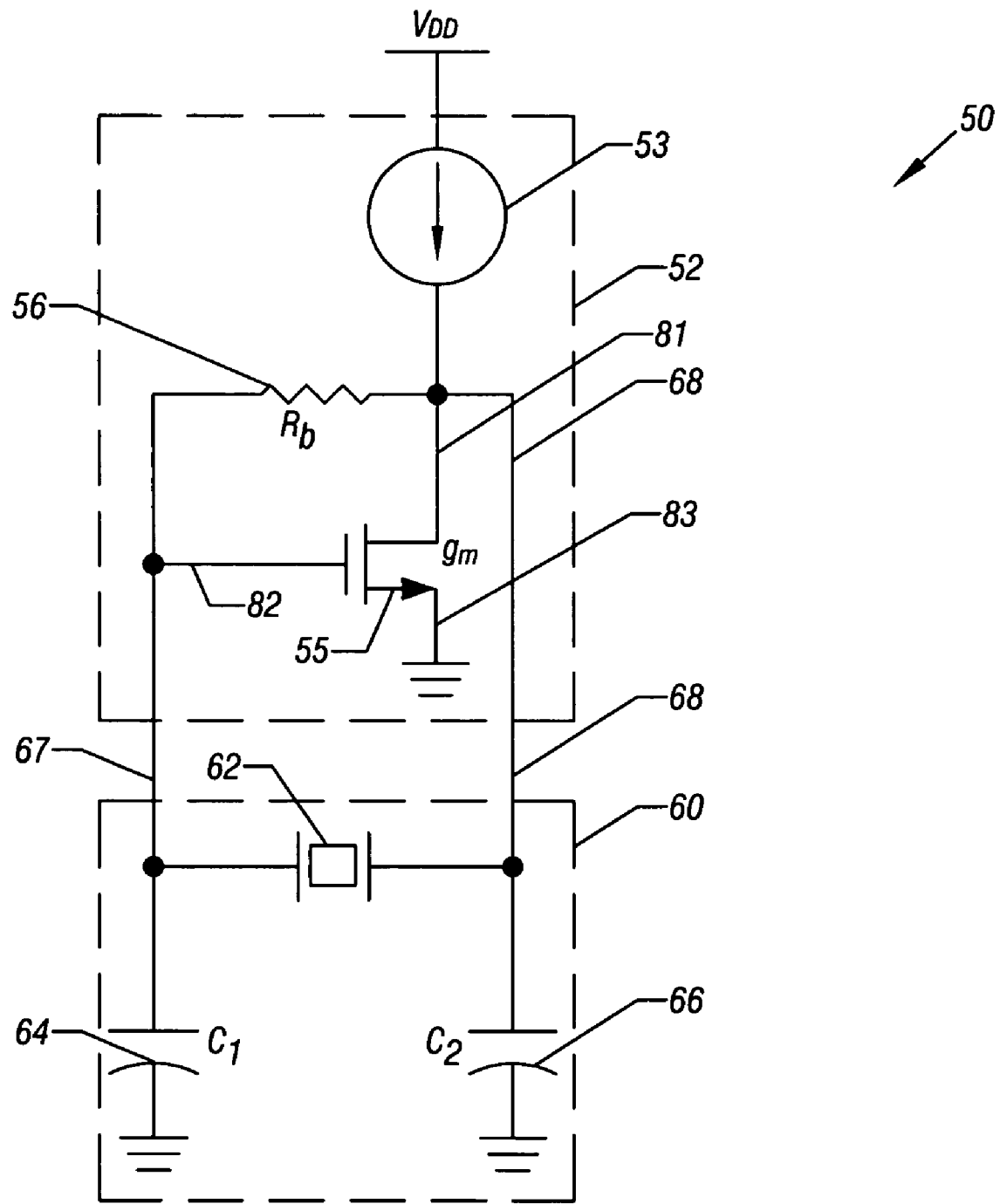
FIG. 2 is a schematic diagram of an oscillator.

A Colpitts-type oscillator, such as a Colpitts oscillator 50 that is depicted in FIG. 2, may be particularly sensitive to a leakage current. The oscillator 50 has a feedback resistor that has a relatively large feedback resistance; and due to this characteristic of the oscillator 50, the presence of a leakage current in the feedback resistor may produce a DC voltage change that, in turn, significantly changes the DC biasing of the oscillator 50 from designed values.

The oscillator 50 includes an amplifier 52 that is electrically coupled to a resonant tank 60 of the oscillator 50. The resonant tank 60 includes a crystal 62 that is coupled between an input terminal 67 of the amplifier 52 and an output terminal 68 of the amplifier 52. The resonant tank 60 also includes a capacitor 64 (having a capacitance called "$C_1$") that is coupled between the input terminal 67 and ground. Furthermore, the resonant circuit 60 includes another capacitor 66 (having a capacitance called "$C_2$") that is coupled between the output terminal 68 and ground.

The amplifier 52 includes a current source 53 that is coupled between a positive supply voltage (called "$V_{DD}$") and the output terminal 68 of the amplifier 52. The current source 53 establishes a bias current for an n-channel metal oxide semiconductor field-effect-transistor (NMOSFET) 55 of the amplifier 52. Drain 81, gate 82 and source 83 terminals of the NMOSFET 55 are coupled to the output terminal 68, input terminal 67 and ground, respectively. As also depicted in FIG. 2, the amplifier 52 includes a feedback resistor 56 (having a resistance called "$R_b$") that has one terminal, which is connected to the output terminal 68; and the other terminal of the feedback resistor 56 is connected to the input terminal 67.

For reasons explained further below, the $R_b$ resistance of the feedback resistor 56 may be relatively large (a resistance in the megaohm range, for example) for purposes of stabilizing the operation of the oscillator 50 and producing an oscillation frequency that remains within a relatively tight tolerance. However, a large $R_b$ resistance means that the oscillator 50 is relatively sensitive to small changes in the current that flows through the resistor 56. For example, although the oscillator 50 may be designed so that the current source 53 furnishes a constant current that in general does not vary with the drain voltage of the NMOSFET 55, a leakage current may cause a larger-than-expected drain bias voltage of the NMOSFET 55, which causes the current source 53 to undesirably linearly vary with the drain voltage or even turn off.

Figure 3:
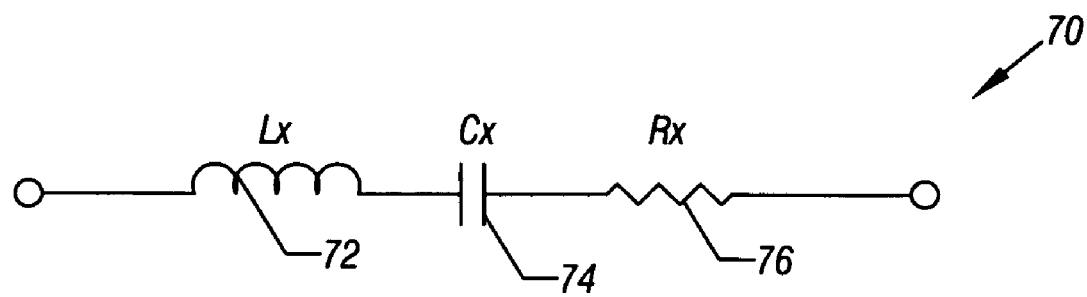
FIG. 3 is a schematic diagram illustrating the impedances of a crystal.

The reason that the $R_b$ resistance is relatively large may be explained by considering specific impedances that may be used for the crystal 62 and oscillator 50. As depicted in FIG. 3, electrically, the impedance of the crystal 62 may be viewed as being formed from the series connections of an inductor 72 (having an inductance called "$L_x$"), a resistor 76 (having a resistance called "$R_x$") and a capacitor 74 (having a capacitance called "$C_x$").

Figure 4:
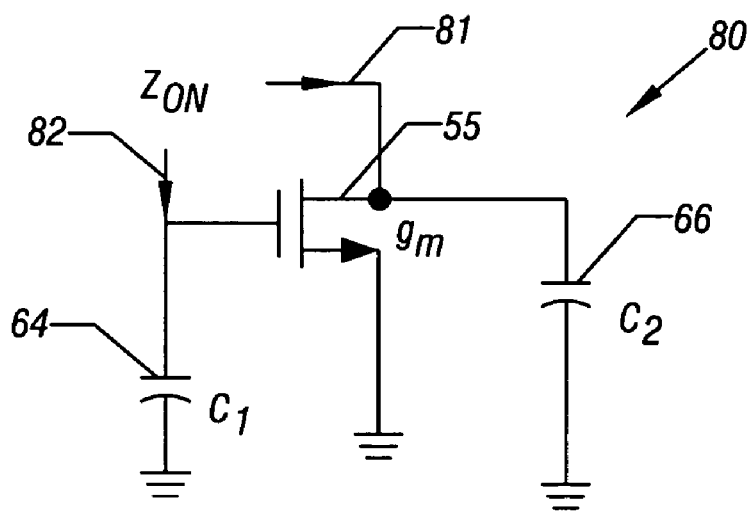
FIG. 4 is a schematic diagram of a portion of the oscillator of FIG. 4 used in an impedance calculation.
Figure 5:
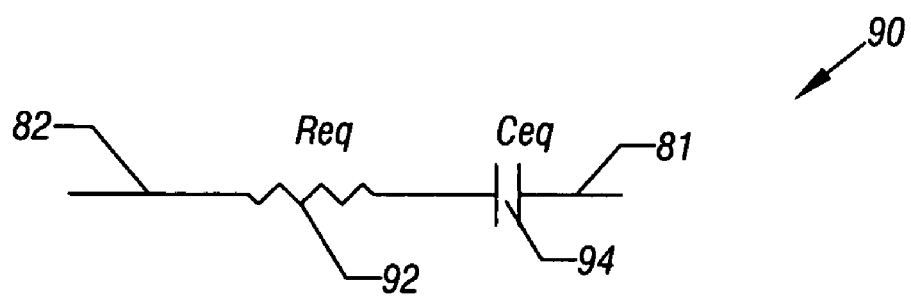
FIG. 5 is a schematic diagram depicting an equivalent impedance of the portion of the oscillator shown in FIG. 4.

Referring to FIG. 4, excluding the $R_b$ resistance and the impedance of the crystal 62, an impedance (called "$Z_{ON}$") of the oscillator 50 as viewed into the gate 81 and drain 82 terminals of the NMOSFET 55 may be mathematically described according to the following equation:

$$Z_{ON} = \frac{-g_m}{\omega^2 C_1 C_2} + \frac{1}{j\omega C_1} + \frac{1}{j\omega C_2}, \quad \text{Eq. 1}$$

where "$g_m$" represents the transconductance of the NMOSFET 55. The $Z_{ON}$ impedance may be represented by an equivalent circuit 90 (FIG. 5) that includes a resistor 92 (having a resistance called "Req") that is in series with a capacitor 94 (having a capacitance called "Ceq.") The Req resistance and the Ceq capacitance are mathematically described below in Equations 2 and 3:

$$Req = \frac{-g_m}{\omega^2 C_1 C_2}, \quad \text{Eq. 2}$$

$$Ceq = \frac{C_1 C_2}{C_1 + C_2}. \quad \text{Eq. 3}$$

Figure 6:
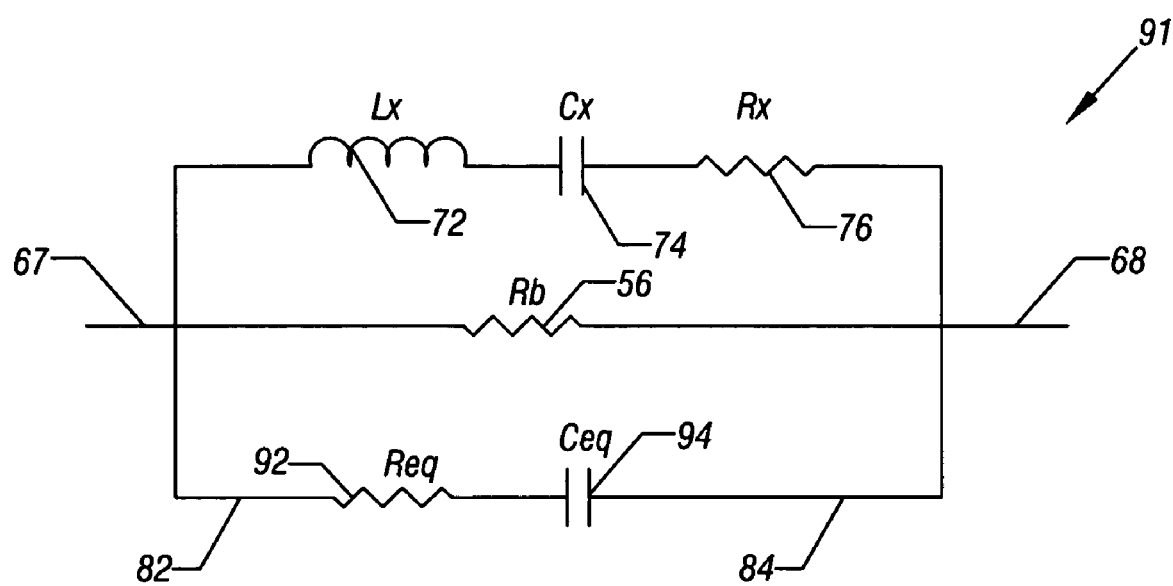
FIG. 6 is a schematic diagram illustrating the impedances of the oscillator of FIG. 4.

Combining the impedance of the crystal 62, the $Z_{ON}$ impedance and the $R_b$ impedance, the impedances of the oscillator 50 may be represented by an equivalent circuit 91 that is depicted in FIG. 6. Thus, the circuit 91 is formed from the parallel connection of the $Z_{ON}$ impedance, the $R_b$ resistance and the impedance of the crystal 62.

As shown by way of specific example below, for typical design values for the oscillator 50, the $R_b$ resistance is typically on the order of several megaohms (tens of megaohms, as a more specific example), a resistance value that may lead to problems if leakage current is routed to the resistor 56.

Turning to the specific example, a 32 kilohertz (kHz) crystal that is typically available may have an Rx resistance (see FIG. 3) of 40 kilohms (kΩ) to 2 kΩ and may use a load capacitance of 6 to 12.5 picoFarads (pF). These parameters mean that the Req resistance is in the range of –40 kΩ to –2 kΩ; and the Ceq capacitance is in the range of 6 pF to 12.5 pF.

Assuming more specific values, the Req resistance may be –40 kΩ, and the Ceq capacitance may be 8 pF. The series combination of the Req resistance and the Ceq capacitance may be transformed into a resistance that is parallel to a capacitance. For the above-described values, this means that –9.26 megaohms (MΩ) is in parallel with an 8 pF capacitor. Thus, in order for the $R_b$ resistance to not significantly reduce the –9.26 MΩ resistance, the Rb resistance has to be much greater than 9.26 MΩ for purposes of making the overall negative resistance between the input 67 and output 68 terminals close to –40 kΩ.

It is noted that if the $R_b$ resistance is less than 9.26 MΩ, it may be still possible to obtain a negative resistance. However, the oscillator 50 has to adjust its operation point to accommodate the lower $R_b$ resistance. Therefore, a challenge with this low resistance is that the low resistance causes the equivalent load capacitance of the oscillator 50 to change, and this change may cause frequency error.

Due to a large $R_b$ resistance value, a leakage current may produce a significant voltage drop across the resistor 56. For example, if the $R_b$ resistance is 20 MΩ, then 30 nanoamperes (nA) of leakage current produces a 600 millivolts (mV) voltage drop across the resistor 56, if the leakage current flows from the drain terminal of NMOSFETs 55 to the gate terminal of NMOSFET 55 through the resistor 56. This voltage drop forces the gate terminal voltage of the NMOSFET 55 to decrease and forces the drain terminal voltage of the NMOSFET 55 to increase. These changes, in turn, may cause the current source 53 (FIG. 3) to be forced into an undesirable linear range or even be turned off.

Possible solutions to de-sensitizing the oscillator's bias point to a leakage current include designing the oscillator 50 with a smaller $R_b$ resistance or limiting the operating temperature of the semiconductor package that contains the oscillator 50. As pointed out above, a smaller $R_b$ resistance decreases the frequency stability of the oscillator. Furthermore, limiting the operation temperature of the semiconductor package may not be an optimal solution. Although it may be possible to design the ESD protection circuits to produce less leakage current, there is typically a tradeoff between the ESD protection performance of the ESD protection circuit and leakage current.

Figure 7:
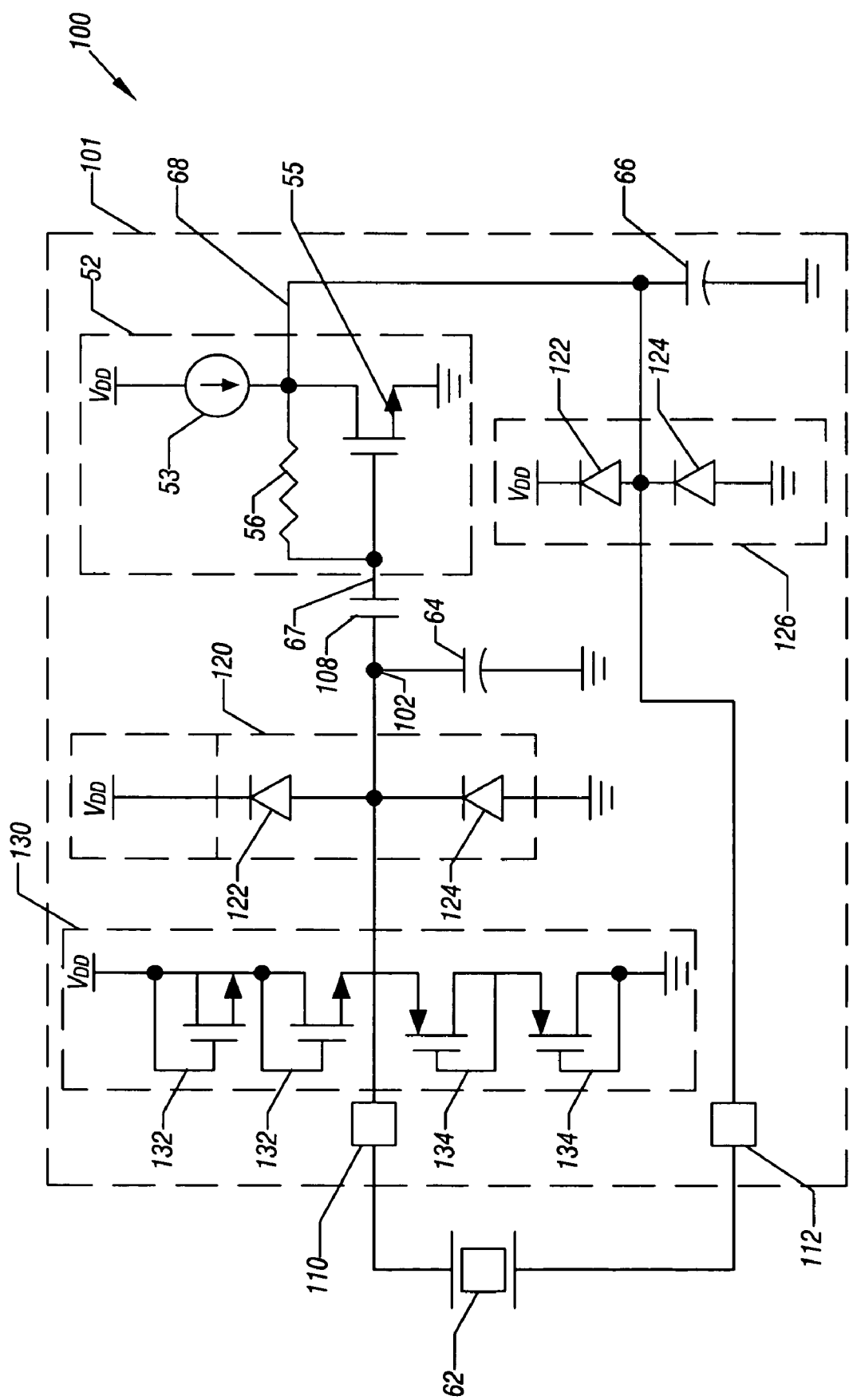
FIG. 7 is a schematic diagram of an integrated circuit oscillator according to an embodiment of the invention.

Referring to FIG. 7, therefore, in accordance with embodiments of the invention, an oscillator 100 may be used in place of the oscillator 50. The oscillator 100 has a similar design to the oscillator 50 except for the following differences. In particular, unlike the oscillator 50, the oscillator 100 includes a high pass filter that may be formed from a capacitor 108, for example. The capacitor 108 serves as a leakage current blocking device for purposes of preventing a leakage current (i.e., a DC current) from either ESD protection circuit 120 or 126 from flowing through the resistor 56, a bias sensitive part of the oscillator 100.

More particularly, in some embodiments of the invention, one terminal of the capacitor 108 is connected to the input terminal 67 of the amplifier 52. The other terminal of the capacitor 108 is connected to a node 102. Unlike the oscillator 50 (FIG. 2), the capacitor 64 is coupled between the node 102 and the negative supply voltage terminal (ground, in this embodiment) ground; and thus, the capacitor 108 separates the node 102 from the input terminal 67. Similar to the oscillator 50, the capacitor 66 is coupled between the output terminal 68 and ground.

Although the oscillator 100 has a Colpitts topology, it is understood that other oscillator topologies may be used, in other embodiments of the invention.

In some embodiments of the invention, the oscillator 100 includes components 101 that are fabricated on a semiconductor die as part of a semiconductor package and the crystal 62, which may be external to the die. In these embodiments of the invention, the crystal 62 is coupled to two bonding pads 110 and 112 of the semiconductor die. The node 102 is coupled to the bonding pad 110; and the output terminal 68 is coupled to the bonding pad 112. As also depicted in FIG. 7, the ESD protection circuit 120 is connected to the bonding pad 110; and the ESD protection circuit 126 is coupled to the bonding pad 112.

Thus, as can be seen from FIG. 7, no DC current path exists between the ESD protection circuit 120 and the feedback resistor 56 of the amplifier 52. More specifically, the capacitor 108 isolates the ESD protection circuit 120 from the input terminal 67, and the inherent capacitance of the crystal 62 (see FIG. 3) isolates the ESD protection circuit 120 from the output terminal 68 of the amplifier 52.

Likewise, no current DC path exists between the ESD protection circuit 126 and the feedback resistor 56. Although the ESD protection circuit 126 is connected to the output terminal 68 of the amplifier 52 any ESD leakage current flowing into the terminal 68 is absorbed by the NMOSFET 55 and does not flow through the resistor 56.

As depicted in FIG. 7, in some embodiments of the invention, each ESD protection circuit 120, 126 includes a diode 122 that is coupled between the bonding pad that is being protected and the $V_{DD}$ supply voltage. More specifically, the cathode of the diode 122 is coupled to the $V_{DD}$ supply voltage, and the anode of the diode 122 is coupled to the pad being protected. The ESD protection circuit 120, 126 also includes a diode 124 that is coupled between the pad that is being protected and the negative supply voltage, which for the embodiment depicted in FIG. 7 is ground. More specifically, the cathode of the diode 124 is coupled to the bonding pad being protected, and the anode of the diode 124 is coupled to ground.

Due to the above-described arrangement, the voltage of the node 102 is indeterminate, or "floats," if not for other features of the oscillator 100. A "floating node," in turn, may adversely affect the operation of the oscillator 100. However, in some embodiments of the invention, the oscillator 100 includes a voltage reference circuit 130 for purposes of establishing a DC bias voltage of the node 102 (and thus, a DC bias voltage of the bonding pad 110). As depicted in FIG. 7, in some embodiments of the invention, the voltage reference circuit 130 may be a MOSFET divider circuit that is formed from NMOSFETs 132 that are coupled between the $V_{DD}$ supply voltage and the bonding pad 110 and p-channel MOSFETs (PMOSFETs) 134 that are coupled between the bonding pad 110 and the negative supply voltage terminal (i.e., ground for the embodiment that is depicted in FIG. 7). Each MOSFET 132, 134 has its gate and drain terminals coupled together.

The aspect ratios (channel width-to-length ratios) of the NMOSFETs 132 and PMOSFETs 134 may be designed so that the reference voltage circuit 130 draws relatively small currents at low temperature and typical process corners. At high temperature and at the FS or SF process corners, the leakage currents from the diodes 122 and 124 may be relatively large and thus, may produce a composite leakage current into or out of the ESD protection circuit. For these conditions, the voltage reference circuit 130 is capable of sinking or sourcing the composite leakage current so that the voltage of the bonding pad 110 does not drift to the $V_{DD}$ supply voltage or ground.

More specifically, at high temperatures and at the FS process corner, the leakage current from the diode 124 is much greater than the leakage current from the diode 122, thereby creating a relatively large composite leakage current that is sourced by the voltage reference circuit 130. However, for these conditions, the nMOSFETs 132 are conducting relatively large currents and are capable of sourcing the composite leakage current. Therefore, the voltage of the bonding pad 110 remains stable.

At high temperatures and at the SF process corner, the leakage current from the diode 122 is significantly greater than the leakage current from the diode 124 to produce a relatively large composite leakage current that the voltage reference circuit 130 sinks. However, for these conditions, the pMOSFETs 134 are conducting relatively currents and are capable of sinking the composite leakage current to keep the voltage of the bonding pad 110 stable.

Thus, the voltage reference circuit 130 generates a stable pad voltage for a wide range of process variations and temperature change, while consuming relatively little power, in some embodiments of the invention. It is noted that the MOSFET divider that is depicted in FIG. 7 is one out of many possible embodiments for the voltage reference circuit 130. For example, for embodiments in which a MOSFET divider is used, the number of nMOSFET and pMOSFET transistors may be adjusted for different power supply voltages and/or bonding pad bias voltages.

Figure 8:
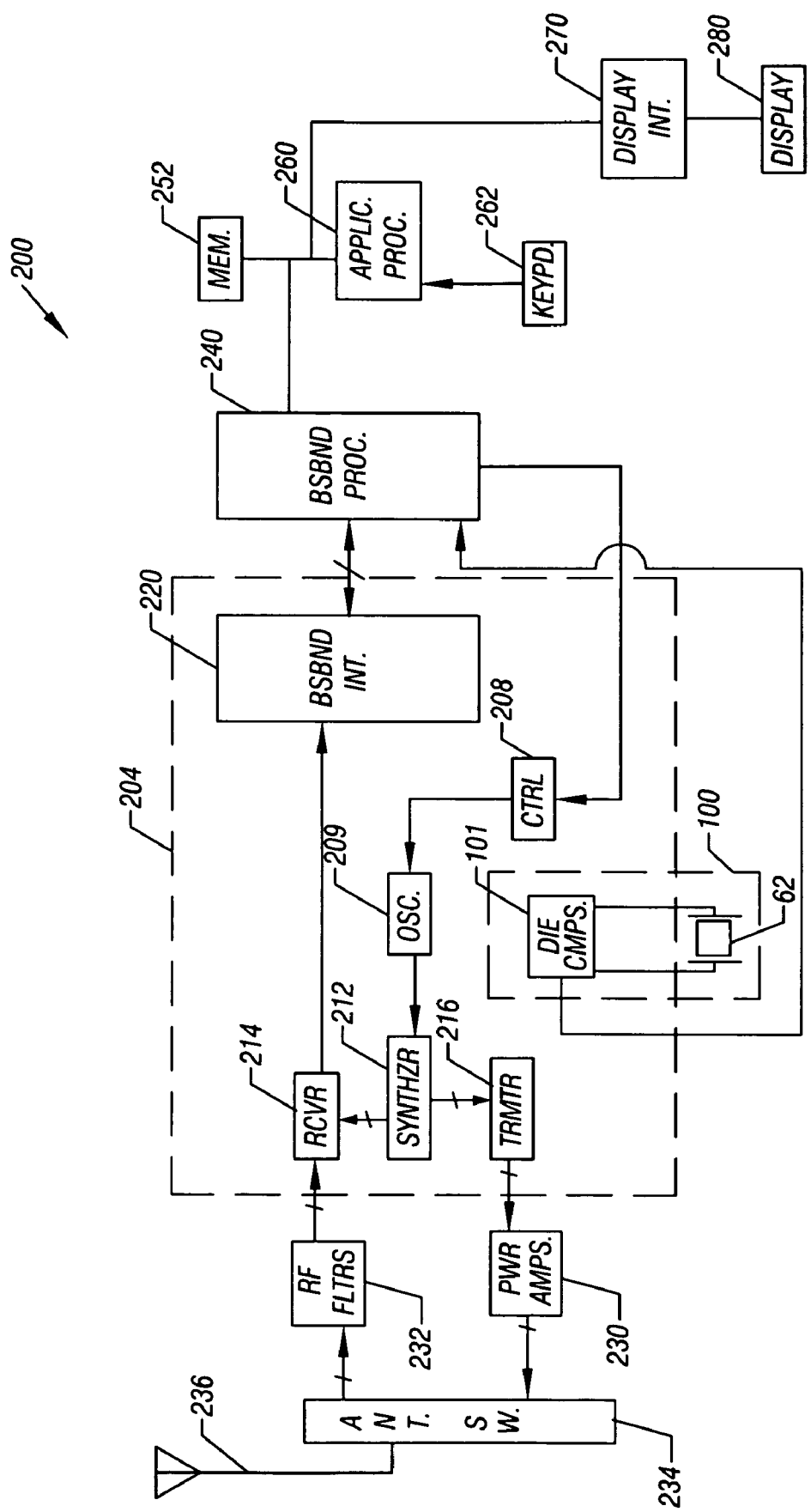
FIG. 8 is a schematic diagram of a wireless system according to an embodiment of the invention.

Referring to FIG. 8, in some embodiments of the invention, the oscillator 100 may be part of a transceiver semiconductor package 204 that, in turn, is part of a wireless system 200. As examples, the wireless system 200 may be a cellular telephone or wireless personal digital assistant (PDA), in some embodiments of the invention.

In some embodiments of the invention, the oscillator 100 generates a reference signal for a baseband processor 240 of the wireless system 200. It is noted that the oscillator 100 topology may be used in different and/or additional oscillators of the wireless system 200 in the various embodiments of the invention.

For example, an oscillator 209 may contain the above-described leakage current blocking features of the oscillator 100. Thus, the oscillator 209 may use an external crystal (not shown in FIG. 8) and connect to the crystal through bonding pads of the package 204, which are subject to ESD protection. The oscillator 209 generates a reference sinusoidal signal from which a synthesizer 212 (of the transceiver semiconductor package 204) may generate various sinusoidal signals that are used by a receiver 214 and a transmitter 216 of the transceiver semiconductor package 204. As depicted in FIG. 8, the transceiver semiconductor package 204 may include a control circuit 208 that receives a control signal from the baseband processor 240 for purposes of fine tuning the frequency of the signal that is produced by the oscillator 209. For example, in some embodiments of the invention, this fine tuning may involve adjusting one or both of the capacitances of the capacitors 64 and 66.

In some embodiments of the invention, the baseband processor 240 may communicate with a baseband interface 220 of the transceiver semiconductor package 204. In some embodiments of the invention, the baseband processor 240 is separate from the semiconductor package 204. However, in other embodiments of the invention, the baseband processor 240 may be part of the semiconductor package 204; and all of the circuitry of the transceiver semiconductor package 204 is fabricated on the same die.

Among the other features of the wireless system 200, in some embodiments of the invention, the wireless system 200 may include power amplifiers 230 that are coupled between the transmitter 216 and an antenna switch 234. The antenna switch 234 is used to select the appropriate standard for communication over an antenna 236. Furthermore, the wireless system 200 may include radio frequency (RF) filters 232 that are coupled between the antenna switch 234 and the receiver 214. In some embodiments of the invention, the baseband processor 240 may be coupled to an application subsystem, a subsystem that includes an application processor 260 and a memory 252. As an example, the application subsystem may also include a display interface 270 that couples the application subsystem to a display 280; and the application subsystem may also include one or more input devices, such as, for example, a keypad 262 that is coupled to the application processor 260.

Although the current blocking circuits are described above as blocking, or isolating, leakage current that is generated by ESD protection circuitry from the feedback resistance Rb, the current blocking circuits also block, or isolate, leakage currents that are generated by a leakage current source that is located outside of the chip (such as leakage current from a printed circuit board (PCB), for example). If not blocked, a leakage current from outside of the semiconductor package may enter through the external terminal 27 (in FIG. 1) and flow through the feedback resistor and significantly affect the DC bias point of oscillator.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. An apparatus comprising:
   an oscillator circuit comprising terminals to couple a second circuit having an impedance to the oscillator circuit; and
   a filter coupled at least one of the terminals to isolate a leakage current from at least part of the oscillator circuit.

2. The apparatus of claim 1, wherein the oscillator circuit comprises an amplifier, and the filter isolates the amplifier from the leakage current.

3. The apparatus of claim 2, wherein the amplifier comprises a feedback impedance, and the filter isolates the feedback impedance from the leakage current.

4. The apparatus of claim 2, wherein the terminals are coupled to an input terminal of the amplifier and an output terminal of the amplifier.

5. The apparatus of claim 1, wherein the second circuit comprises a crystal.

6. The apparatus of claim 1, wherein the oscillator circuit comprises:
   an amplifier; and
   capacitors coupled to the amplifier to form a resonant tank with the impedance.

7. The apparatus of claim 1, further comprising:
   an electrostatic discharge protection circuit coupled to at least one of the terminals and capable of generating the leakage current.

8. The apparatus of claim 7, wherein the oscillator circuit, electrostatic discharge protection circuit and the filter are part of a semiconductor package, and the second circuit is external to the semiconductor package.

9. The apparatus of claim 1, wherein the filter comprises a high pass filter.

10. The apparatus of claim 1, further comprising a voltage reference circuit to bias a terminal of the filter.

11. The apparatus of claim 10, wherein the voltage reference circuit comprises a transistor divider circuit that comprises:
    at least one n-channel metal-oxide-semiconductor field-effect-transistor coupled between the terminal of the high pass filter and a first voltage supply terminal; and
    at least one p-channel metal-oxide-semiconductor field-effect-transistor coupled between the terminal of the high pass filter and a second voltage supply terminal.

12. A method comprising:
    coupling an electrostatic discharge protection circuit to an oscillator; and
    isolating leakage current generated by the electrostatic discharge protection circuit from at least part of the oscillator during a state of the oscillator in which said at least part of the oscillator communicates an oscillating signal.

13. The method of claim 12, wherein the isolating comprises:
    isolating an amplifier of the oscillator from the leakage current.

14. The method of claim 12, wherein the isolating further comprises:
   isolating a feedback impedance of the amplifier from the leakage current.

15. The method of claim 14, further comprising:
   coupling the feedback impedance between an input terminal of the amplifier and an output terminal of the amplifier.

16. The method of claim 12, further comprising:
   coupling an impedance to the electrostatic discharge protection circuit and to the oscillator.

17. The method of claim 16, wherein the impedance comprises a crystal.

18. A system comprising:
   an oscillator circuit to provide a reference signal, the oscillator circuit comprising terminals to couple a second circuit having an impedance to the oscillator circuit;
   an electrostatic discharge protection circuit coupled to one of the terminals and capable of generating a leakage current;
   a fourth circuit to isolate the leakage current from at least part of the oscillator circuit while the oscillator circuit provides the reference signal; and
   a radio frequency circuit to receive the reference signal.

19. The system of claim 18, wherein the oscillator circuit comprises an amplifier, and the fourth circuit isolates the amplifier from the leakage current.

20. The system of claim 19, wherein the amplifier comprises a feedback impedance, and the fourth circuit isolates the feedback impedance from the leakage current.

21. The system of claim 19, wherein the terminals are coupled to an input terminal of the amplifier and an output terminal of the amplifier.

22. The system of claim 18, wherein the second circuit comprises a crystal.

23. The system of claim 18, wherein the oscillator circuit comprises:
   an amplifier; and
   capacitors coupled to the amplifier to form a resonant tank with the second circuit.

24. The system of claim 18, wherein the radio frequency circuit comprises a transceiver.

25. The system of claim 18, wherein the oscillator circuit, electrostatic discharge protection circuit and fourth circuit are part of a semiconductor package, and the second circuit is external to the semiconductor package.

26. The system of claim 18, wherein the fourth circuit comprises a filter to isolate the leakage current.

27. An apparatus comprising:
   a die comprising oscillator circuitry; and
   a filter to isolate leakage current from at least part of the oscillator circuitry.

28. The apparatus of claim 27, wherein the circuit is fabricated on the die.

29. The apparatus of claim 27, wherein the circuit isolates an amplifier of the oscillator circuitry from the leakage current.

30. The apparatus of claim 27, wherein the circuit isolates a feedback resistor of the amplifier from the leakage current.

31. The apparatus of claim 27, wherein at least some of the leakage current originates with a source external to the die.

32. An apparatus comprising:
   an oscillator circuit comprising terminals to couple a second circuit having an impedance to the oscillator circuit;
   a high pass filter coupled to at least one of the terminals to isolate a leakage current from at least part of the oscillator circuit; and
   a voltage reference circuit to bias a terminal of the high pass filter.

33. The apparatus of claim 32, further comprising:
   an electrostatic discharge protection circuit coupled to at least one of the terminals and capable of generating the leakage current.

34. The apparatus of claim 32, wherein the voltage reference circuit comprises a transistor divider circuit.

35. A method comprising:
   coupling an electrostatic discharge protection circuit to an oscillator;
   isolating leakage current generated by the electrostatic discharge protection circuit from at least part of the oscillator, comprising isolating a first node of the oscillator from a second node of the oscillator;
   coupling an impedance to the first node;
   coupling the electrostatic discharge protection circuit to the first node; and
   regulating a voltage of the first node.

36. The method of claim 35, wherein the isolating comprises at least one of isolating an amplifier of the oscillator from the leakage current and isolating a feedback impedance of the amplifier from the leakage current.

37. A system comprising:
   an oscillator circuit to provide a reference signal, the oscillator circuit comprising terminals to couple a second circuit having an impedance to the oscillator circuit;
   an electrostatic discharge protection circuit coupled to one of the terminals and capable of generating a leakage current;
   a high pass filter to isolate the leakage current from at least part of the oscillator circuit;
   a radio frequency circuit to receive the reference signal; and
   a voltage reference circuit to bias a terminal of the high pass filter.

* * * * *

UNITED STATES PATENT AND TRADEMARK OFFICE
CERTIFICATE OF CORRECTION

| | | |
|---|---|---|
| PATENT NO. | : 7,193,483 B2 | Page 1 of 1 |
| APPLICATION NO. | : 11/089310 | |
| DATED | : March 20, 2007 | |
| INVENTOR(S) | : Wenjun Sheng | |

It is certified that error appears in the above-identified patent and that said Letters Patent is hereby corrected as shown below:

<u>Column 8</u>:
Line 14, "coupled at least one" should be --coupled to at least one--.

Signed and Sealed this

Twenty-ninth Day of May, 2007

JON W. DUDAS
*Director of the United States Patent and Trademark Office*